US008022512B2

(12) United States Patent
Ramos et al.

(10) Patent No.: US 8,022,512 B2
(45) Date of Patent: Sep. 20, 2011

(54) NO LEAD PACKAGE WITH HEAT SPREADER (75) Inventors: Mary Jean Bajacan Ramos, Alessandrea (SG); Romarico Santos San Antonio, Batam Island (ID); Anang Subagio, Batam Island (ID)

(73) Assignee: Unisem (Mauritus) Holdings Limited, Port Louis (MU)

( * ) Notice: Subject to any disclaimer, the term of this patent is extended or adjusted under 35 U.S.C. 154(b) by 0 days.

(21) Appl. No.: 11/670,650

(22) Filed: Feb. 2, 2007

(65) Prior Publication Data
US 2007/0200207 A1 Aug. 30, 2007

Related U.S. Application Data (60) Provisional application No. 60/777,316, filed on Feb. 28, 2006.

(51) Int. Cl.
*H01L 23/495* (2006.01)
(52) U.S. Cl. .................................................... 257/666
(58) Field of Classification Search .................. 257/666
See application file for complete search history.

(56) References Cited

U.S. PATENT DOCUMENTS

| 5,608,267 | A | 3/1997 | Mahulikar et al. |
| 5,650,663 | A | 7/1997 | Parthasarathi |
| 5,977,626 | A | 11/1999 | Wang et al. |
| 6,177,718 | B1* | 1/2001 | Kozono ........................ 257/666 |
| 6,432,742 | B1 | 8/2002 | Guan et al. |
| 6,432,749 | B1* | 8/2002 | Libres .......................... 438/122 |
| 6,482,680 | B1 | 11/2002 | Khor et al. |
| 6,661,087 | B2 | 12/2003 | Wu |
| 6,677,185 | B2 | 1/2004 | Chin et al. |
| 6,979,594 | B1 | 12/2005 | Fan et al. |

FOREIGN PATENT DOCUMENTS

| WO | 2004032186 A2 | 4/2004 |
| WO | WO 2004032186 A2 * | 4/2004 |
| WO | 2005017968 A2 | 2/2005 |

OTHER PUBLICATIONS

International Searching Authority, "International Search Report and the Written Opinion," mailed Feb. 26, 2008 in regards to International Application No. PCT/US2007/04691.

* cited by examiner

*Primary Examiner* — David Vu
*Assistant Examiner* — Brandon Fox
(74) *Attorney, Agent, or Firm* — Wiggin and Dana LLP (57) ABSTRACT

A no-lead electronic package including a heat spreader and method of manufacturing the same. This method includes the steps of selecting a matrix or mapped no-lead lead frame with die receiving area and leads for interconnect; positioning an integrated circuit device within the central aperture and electrically interconnecting the integrated circuit device to the leads; positioning a heat spreader in non-contact proximity to the integrated circuit device such that the integrated circuit device is disposed between the leads and the heat spreader; and encapsulating the integrated device and at least a portion of the heat spreader and leads in a molding resin.

5 Claims, 9 Drawing Sheets

NO LEAD PACKAGE WITH HEAT SPREADER

CROSS REFERENCE TO RELATED APPLICATION(S)

This application claims the benefit of U.S. Provisional Application No. 60/777,316, filed Feb. 28, 2006, which is incorporated by reference as if disclosed herein in its entirety.

BACKGROUND OF THE INVENTION (1) Field of the Invention

This invention relates to packages for encapsulating one or more semiconductor devices, and more particularly to a method for the assembly on a no-lead package having exceptional thermal performance.

(2) Description of the Related Art

In lead frame based semiconductor packages, electrical signals are transmitted between at least one semiconductor device (die) and external circuitry, such as a printed circuit board, by an electrically conductive lead frame. The lead frame includes a number of leads, each having an inner lead end and an opposing outer lead end. Inner lead ends are electrically interconnected to input/output (I/O) pads on the die and outer lead ends provide terminals outside the package body for interconnection to external circuitry. When the outer lead end terminates at the face of the package body, the package is known as a "no lead" package. If the outer leads extend beyond the package body perimeter, the package is referred to as "leaded." Examples of well known no-lead packages include quad flat no lead (QFN) packages which have four sets of leads disposed around the perimeter of the bottom of a square package body and dual flat no lead (DFN) packages which have two sets of lead disposed along opposite sides of the bottom of a package body. Interconnection of the die to the inner lead ends is typically performed using wire bonding, tape automated bonding (TAB) or flip chip bonding. In wire bonding or TAB bonding, the inner lead ends terminate a distance from the die and are electrically interconnected to I/O pads on an electrically active face of the die by small diameter wires or conductive tape. The die may be supported by a die pad which is surrounded by the leads. In flip chip bonding, the inner lead ends of the lead frame extend beneath the die and the die is flipped so that the I/O pads on the electrically active face of the die contact the inner lead ends by a direct electrical contact, such as a solder joint.

A representative QFN package and its method of manufacture is more fully disclosed in commonly owned U.S. patent application Ser. No. 10/563,712 published as PCT International Application No. WO2005/017968 A2 on Feb. 24, 2005. The disclosure of U.S. patent application Ser. No. 10/563,712 is incorporated by reference in its entirety herein.

An ongoing objective for the designers of no lead semiconductor packages is better thermal management. That is, the ability to remove heat from the electrically active semiconductor die. The QFN is one of the best lead frame based packages in terms of thermal management and cost, but as integrated circuit devices become more complex, there is a need for improved thermal and electrical performance. Among the options available in the market are the use of heavy wires and metal ribbons to conduct heat away from the integrated circuit die.

The use of a heat spreader in a leaded package is disclosed in U.S. Pat. No. 5,608,267 to Mahulikar et al. The use of the heat spreader with a substrate based package is disclosed in U.S. Pat. Nos. 5,977,626 to Wang et al. and 6,432,749 to Libres. The disclosures of U.S. Pat. Nos. 5,608,267; 5,977,626 and 6,432,749 are all incorporated by reference in their entireties herein.

None of the prior art designs include a no-external lead, lead frame based package having a heat spreader. Such a package would have enhanced thermal performance as compared to the QFN and other no-lead type packages presently known.

BRIEF SUMMARY OF THE INVENTION

One aspect of the invention is a method for the manufacture of a no-lead electronic package. The method includes the following: providing a lead frame having desired features including a plurality of leads terminating about a central aperture; positioning an integrated circuit device within the central aperture and electrically interconnecting the integrated circuit device to the leads; positioning a heat spreader in non-contact proximity to the integrated circuit device such that the integrated circuit device is disposed between the leads and the heat spreader; and encapsulating the semiconductor device and at least a portion of the heat spreader and leads in a molding resin.

Another aspect of the invention is a semiconductor package, which includes the following: a plurality of leads having inner ends and outer ends disposed about a centrally disposed die pad with a plurality of die pad tie bars extending outward therefrom; an integrated circuit device having an electrically inactive face bonded to the die pad and electrically active face electrically interconnected to the inner leads by wires or TAB bonds; a heat spreader in non-contact proximity to the electrically active face whereby the integrated circuit device is disposed between the die pad and the heat spreader; and a molding resin encapsulating the integrated circuit device, at least a portion of the heat spreader and all but a planar surface of the die pad and the outer ends.

Yet another aspect of the invention is a semiconductor package, which includes the following: a plurality of leads having inner ends and outer ends disposed about a centrally disposed aperture; an integrated circuit device spanning the aperture and having an electrically active face directly bonded to the inner ends of the plurality of leads by a solder; a heat spreader in non-contact proximity to an electrically inactive face of aid integrated circuit device whereby the integrated circuit device is disposed between the plurality of leads and the heat spreader; and a molding resin encapsulating the integrated circuit device, at least a portion of the heat spreader, and all but a planar surface of the die pad and the outer ends.

BRIEF DESCRIPTION OF THE DRAWINGS

For the purpose of illustrating the invention, the drawings show a form of the invention that is presently preferred. However, it should be understood that the present invention is not limited to the precise arrangements and instrumentalities shown in the drawings, wherein.

DETAILED DESCRIPTION

Figure 1:
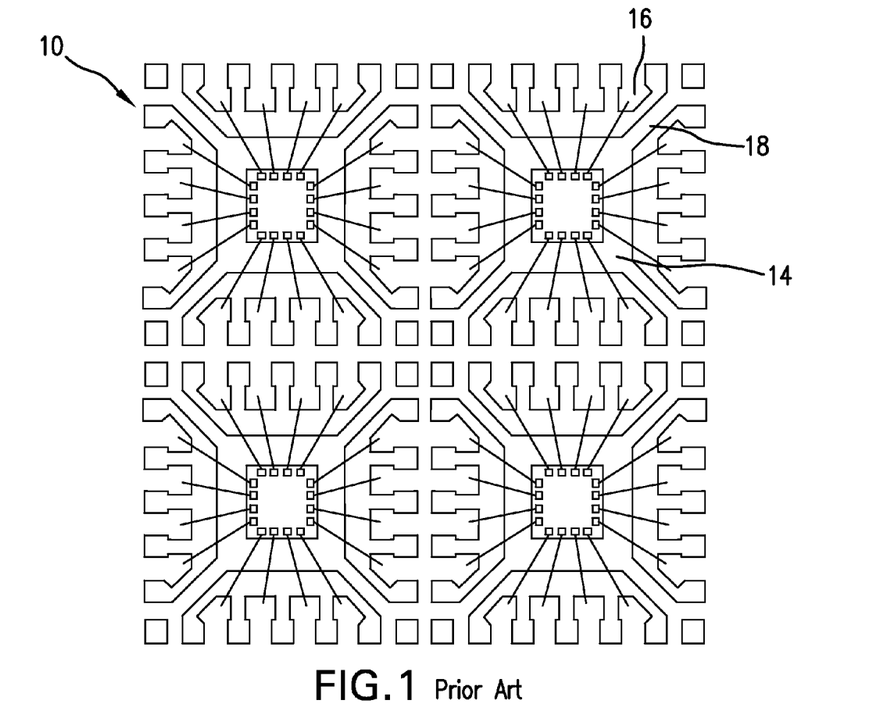
FIG. 1 is a top planar view of a lead frame matrix as known from the prior art for use in the invention.

FIG. 1 illustrates in top planer view a matrix 10 of lead frames as known from the prior art. Typically, the lead frames are formed from an electrically conductive material that is amenable to controlled chemical etching. Suitable materials include copper and copper alloys, iron-nickel alloys, and aluminum and aluminum alloys. Package features defined by the etch include die pads 14, leads 16 and tie bars 18. It is noted that not all features are required for every type package. For example, the die pad 14 is optional in a flip chip package. The matrix forms a repetitive array of package features such that on completion of the assembly process, the array is singulated to a plurality of individual packages.

Figures 2, 3:
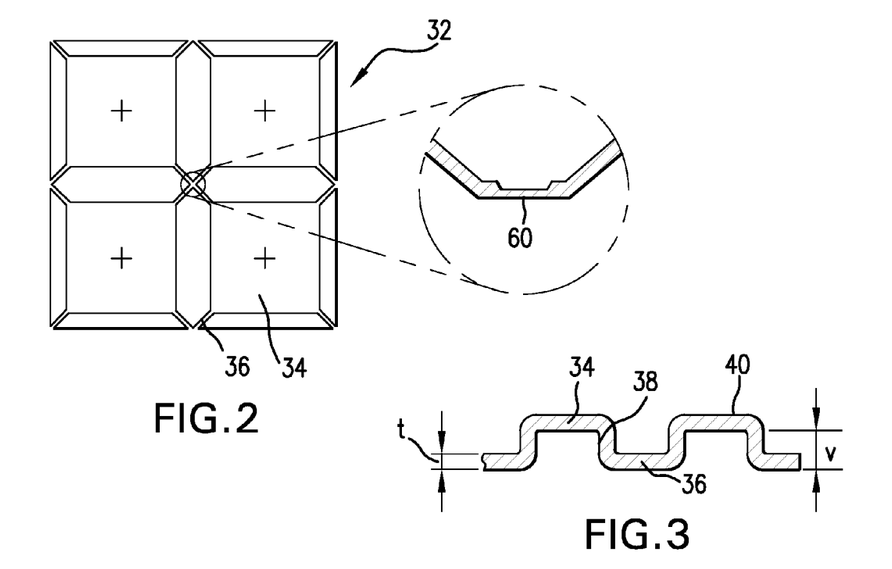
FIG. 2 is a top planar view of a heat spreader matrix for use in the lead frame array and semiconductor die assembly.
FIG. 3 is a cross-sectional view of the heat spreader array of FIG. 2.

A heat spreader that improves the thermal capability of the QFN package is illustrated in top planer view in FIG. 2 and cross-sectional representation in FIG. 3. A metallic sheet is chemically etched or mechanically punched to form a matrix 32 of heat spreaders 34 interconnected one to another by heat spreader tie bars 36. The heat spreader 34 and heat spreader tie bars 36 have a typical thickness in the range of 0.1 millimeter to 1.0 millimeter. The heat spreader 34 is formed from a ductile, high thermal conductivity metal such as copper, aluminum and alloys thereof. The heat spreader may be coated to impart a color to enhance contrast for package marking or to impart enhanced and resistance to environmental corrosion. For example, when the heat spreader is formed from copper or a copper-base alloy, it may be coated with nickel by an electrolytic or electroless process. When formed from aluminum or an aluminum alloy, it may be anodized, such as a black anodization process. As shown in FIG. 3, subsequent to etching or punching, portions 38 of the tie bars 36 may be mechanically formed to elevate the heat spreaders 34 relative to tie bars 36. This upset elevates the heat spreader 34 for an amount effective to provide clearance from the wires of a wire bonded package and to enable top most surface 40 to be exposed following package molding if desired. A typical amount of upset, u, is between 0.25 mm and 0.7 mm.

With reference to the insert expanding a portion of FIG. 2, portion 60 of heat spreader tie bars 36 may imparted with a reduced thickness during etching to facilitate singulation. Such partial etching may also be used on that portion of lead tie bars that is cut during singulation.

Figure 4:
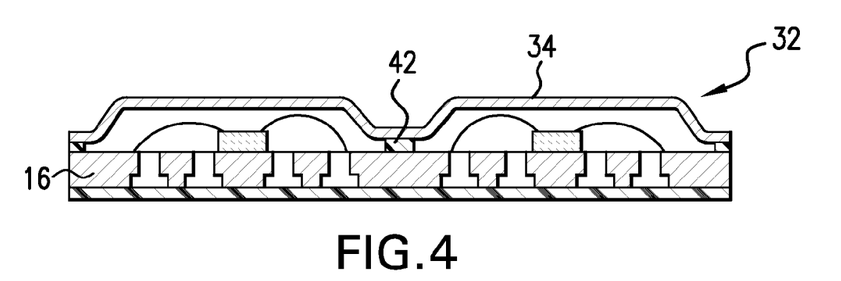
FIG. 4 is a cross-sectional representation illustrating the heat spreader array bonded to the lead frame array and semiconductor die assembly.

With reference to FIG. 4, the array 32 of heat spreaders 34 is then attached to a feature, such as leads 16 or tie bars to be in non-contact proximity to the die. The array 32 may be attached by an adhesive 42 such as an epoxy or conductive tape. Adhesive 42 is optional and the array 32 may be simply placed in position and held firm with a molding resin.

Figure 5:
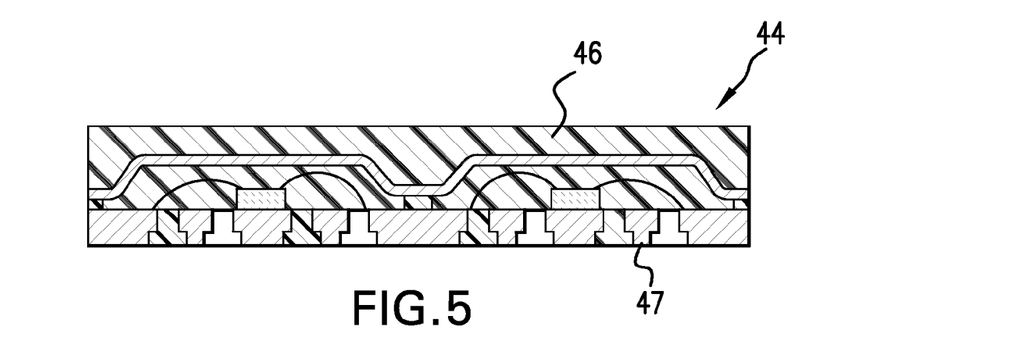
FIG. 5 is a cross-sectional representation of a molded package array formed by the process of the invention.
Figure 6:
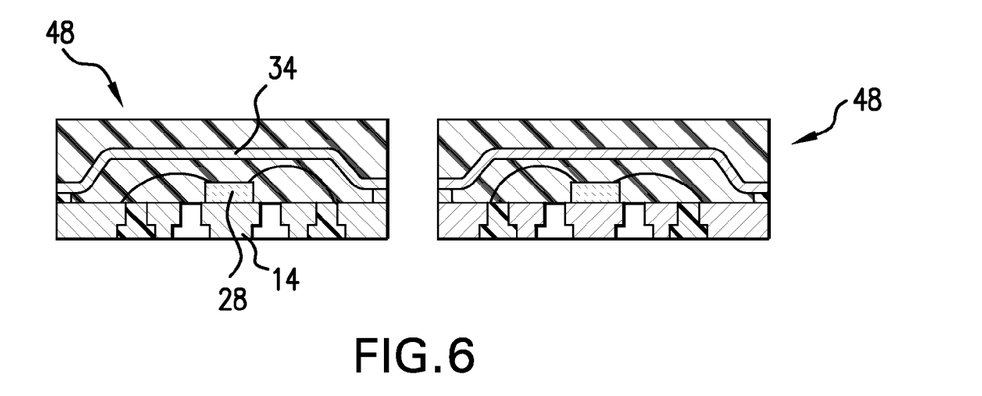
FIG. 6 is a cross-sectional representation of singulated wire-bonded packages formed by the process of the invention.

FIG. 5 shows in cross-sectional representation an array 44 after a molding resin 46 has encapsulated the package. Encapsulated components and features include the die, at least a portion of the heat spreader and all but an out lead end 47. A typical molding resin is a dielectric polymer. The assembly of FIG. 4 is placed in a suitable mold and molding resin at an elevated temperature is introduced into the mold forming the array of packages 44 shown in FIG. 5. After encapsulation, the array of packages is singulated such as by sawing or punching to form individual packages 48 as illustrated in FIG. 6.

The die 28 is disposed between two metallic plates, the die pad 14 and heat spreader 34. This provides shielding from both electric and magnetic fields for electrically sensitive devices.

Figure 7:
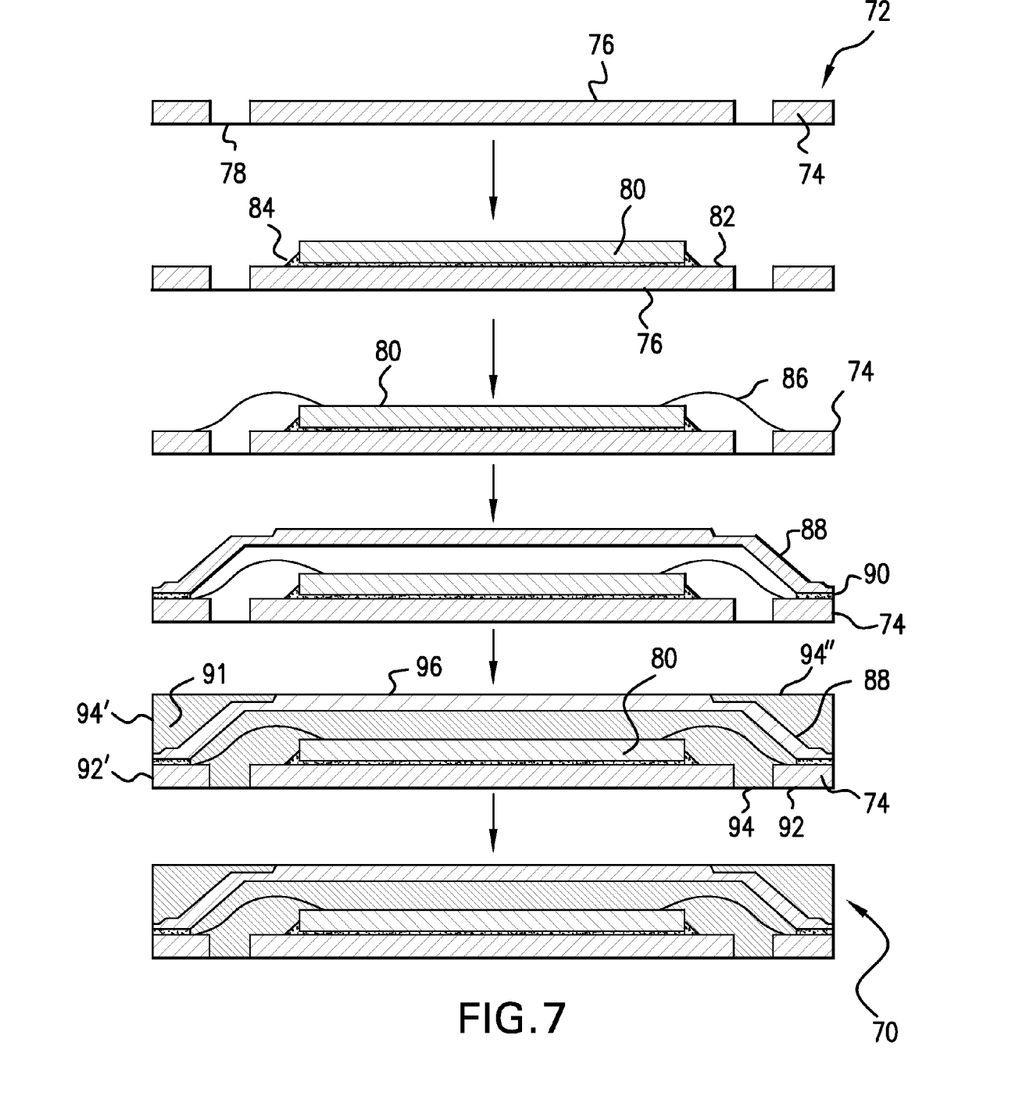
FIG. 7 illustrates in cross-sectional representation a process sequence for a wire-bonded package in accordance with the invention.

FIG. 7 illustrates a process flow to manufacture a wire bonded package 70 in accordance with the invention. A lead frame 72 that may be a member of a matrix or a single lead frame is etched to possess desired features such as leads 74 and a die pad 76. To support the features following etching, a backing strip 78, such as an adhesive tape is applied.

An integrated circuit device 80 is bonded to an interior surface 82 of die pad 76 by a die attach 84. Typical die attach material include gold/tin alloy eutectics, gold/silver alloy eutectics, various silver-base alloys and metal filled polymers. Wire bonds 86 or TAB tape then electrically interconnect leads 74 to I/O pads on an electrically active face of the integrated circuit device 80. The electrically active face of the integrated circuit device 80 includes circuitry and I/O pads while the opposing electrically inactive face is devoid of these features.

Heat spreader 88 is next positioned on the leads 74. Optionally, the heat spreader 88 is affixed to the leads 74 or lead frame tie bars by an adhesive 90 such as an epoxy or conductive tape. Such as an epoxy or conductive tape. A molding resin 91 then encapsulates the integrated circuit device 80, at least a portion of the heat spreader 88 and a portion of the leads 74. At least one outer lead surface 92, 92' is exposed and forms a planar surface with the sidewalls 94, 94' of the molding resin. An outermost surface 96 of the heat spreader 88 may also be exposed and forms a planar surface with sidewall 94" of the molding resin.

If the lead frame and heat spreader were provided as members of a matrix, the final step is singulation. If single unit lead frame and heat spreader were used, then singulation is not required.

Figure 8:
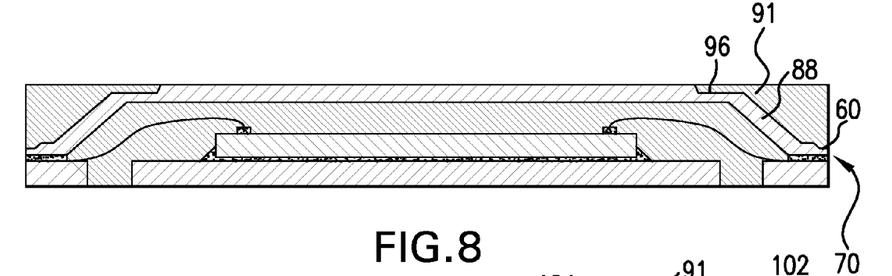
FIG. 8 illustrates in cross-sectional representation a package formed according to the method of the invention.

An enlarged view of the package 70 is illustrated in cross-sectional representation in FIG. 8. The package includes a thinned portion 60 of the heat spreader tie bars to facilitate singulation by sawing or punching. A second thinned portion 96 mechanically locks the heat spreader 88 in molding resin 91.

Figure 9:
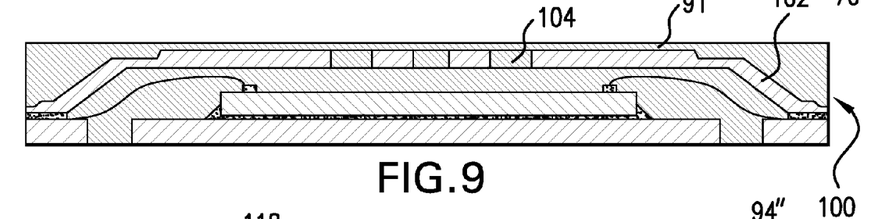
FIG. 9 illustrates in cross-sectional representation a package formed according to the method of the invention.

A first alternative package 100 is illustrated in FIG. 9. In this package, the heat spreader 102 includes a plurality of apertures 104 such that molding resin 91 projects through the apertures to mechanically lock the head spreader in the molding resin. The plurality of apertures 104 may be used in combination with any of the package configurations described herein.

Figure 10:
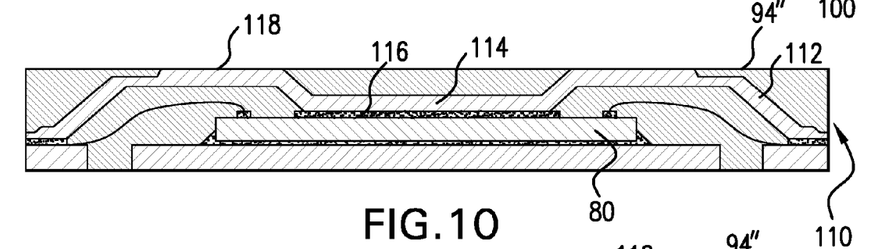
FIG. 10 illustrates in cross-sectional representation a package formed according to the method of the invention.

A second alternative package 110 is illustrated in FIG. 10. In this package, the heat spreader 112 has a recessed central portion 114. A thermally conductive grease or adhesive such as an epoxy 116 or conductive tape provides good thermal conduction. The thermally conductive grease or epoxy may be a dielectric or electrically conductive depending on the application. When used as a wire bond replacement, it is selected to be electrically conductive. If only for thermal dissipation and not intended to electrically interconnect to I/O pads, then it is selected to be a dielectric to prevent shorting. Peripheral portions 118 of the heat spreader form a planar surface with a sidewall 94" of the package 110 to facilitate the removal of heat by forced air, thermal fluid or contact with an external heat sink.

Figure 11:
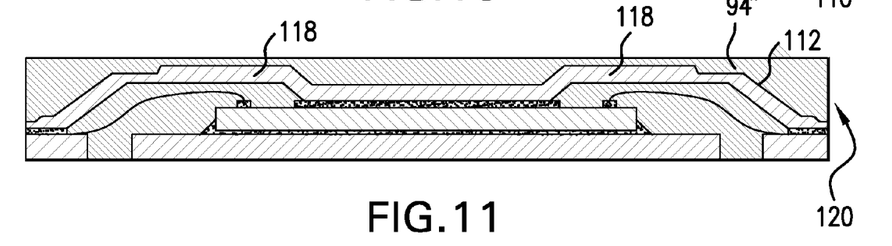
FIG. 11 illustrates in cross-sectional representation a package formed according to the method of the invention.

A third alternative package 120 illustrated in FIG. 11 is similar to the package of FIG. 10 except that peripheral portions 118 of heat spreader 112 do not form a portion of the sidewall 94" of the package.

Figure 12:
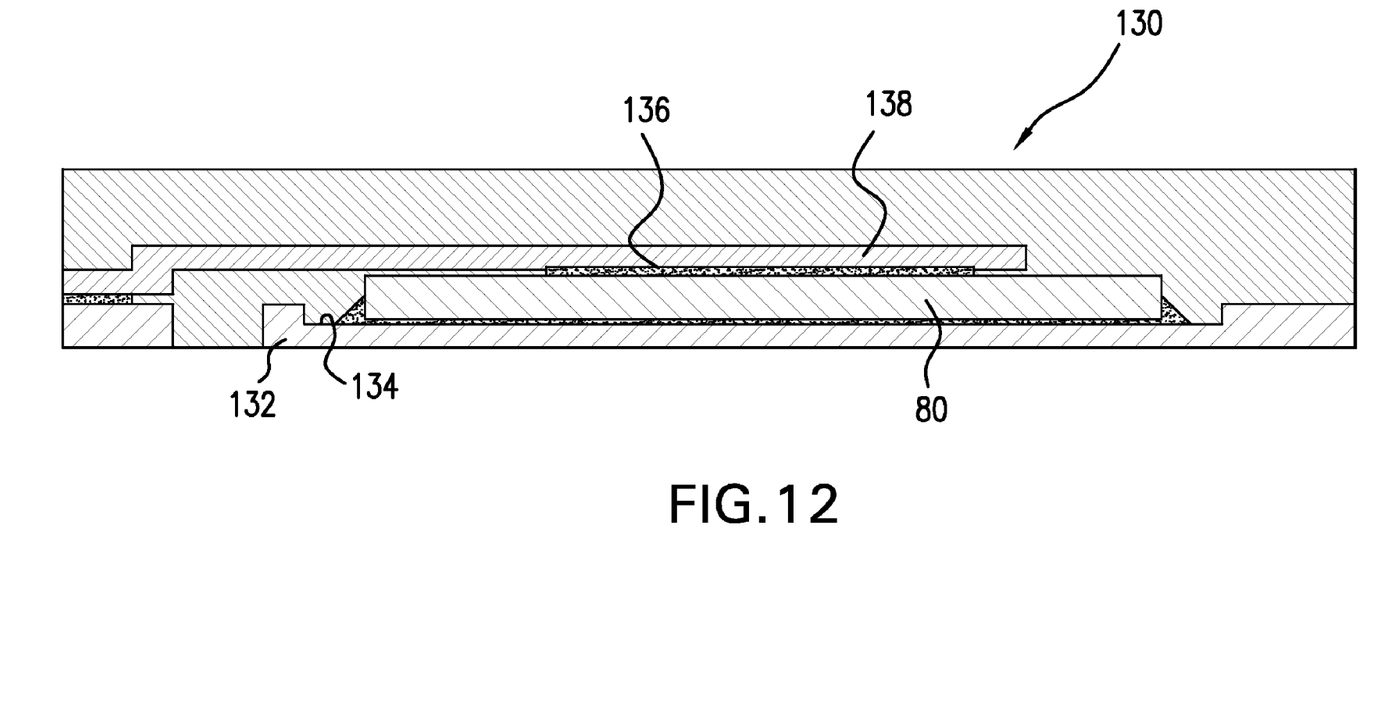
FIG. 12 illustrates in cross-sectional representation a package formed according to the method of the invention.

A fourth alternative package 130 is illustrated in FIG. 12. The package 130 has a die pad 132 with a recessed central portion 134. An electrically conductive, thermally conductive adhesive such as a thermal grease 136, epoxy, or conductive tape provides both electrical and thermal connectivity between an electrically active face of the integrated circuit device 80 and heat spreader 138. An exemplary electrically conductive, thermally conductive thermal grease is an emulsion of ceramic or metal particles, such as silver, copper and/or aluminum based, in an organic or silicone fluid. Alternatively, the thermal grease 136 may be replaced with an electrically conductive, thermally conductive epoxy such as a silver filled epoxy or a dispensable solder paste.

Figure 13:
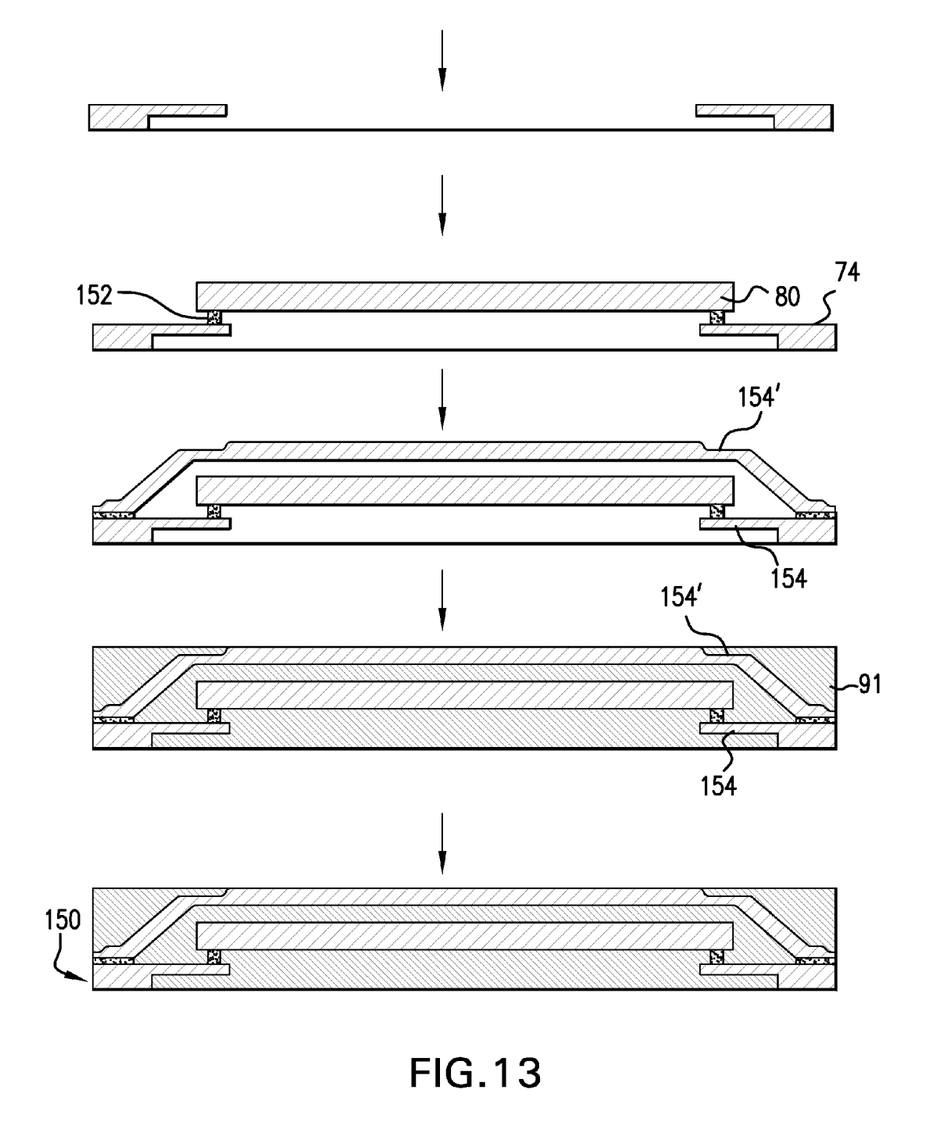
FIG. 13 illustrates a method to assemble a flip-chip bonded package formed by the process of the invention.
Figure 14:
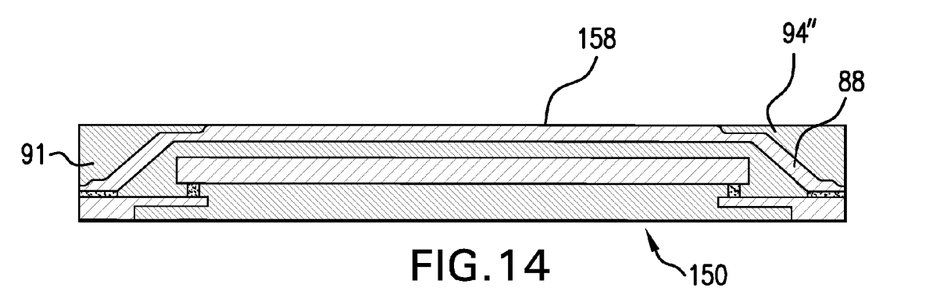
FIG. 14 is a cross-sectional representation of a flip-chip bonded package formed by the process of the invention.
Figure 15:
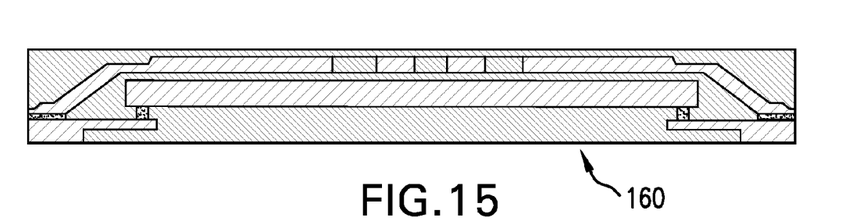
FIG. 15 is a cross-sectional representation of another flip-chip bonded package formed by the process of the invention.
Figure 16:
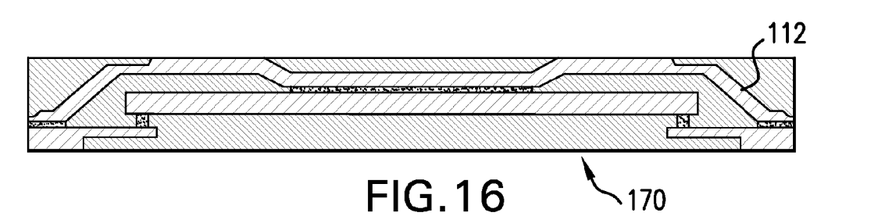
FIG. 16 is a cross-sectional representation of another flip-chip bonded package formed by the process of the invention.
Figure 17:
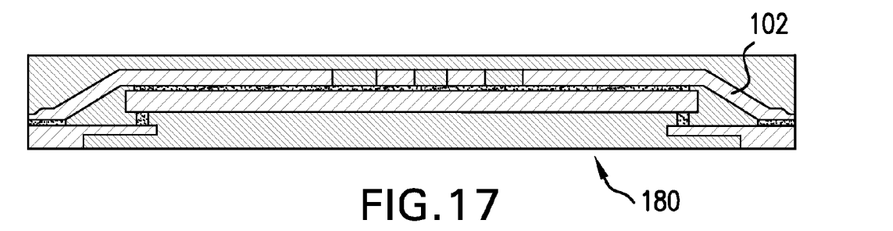
FIG. 17 is a cross-sectional representation of another flip-chip bonded package formed by the process of the invention.
Figure 18:
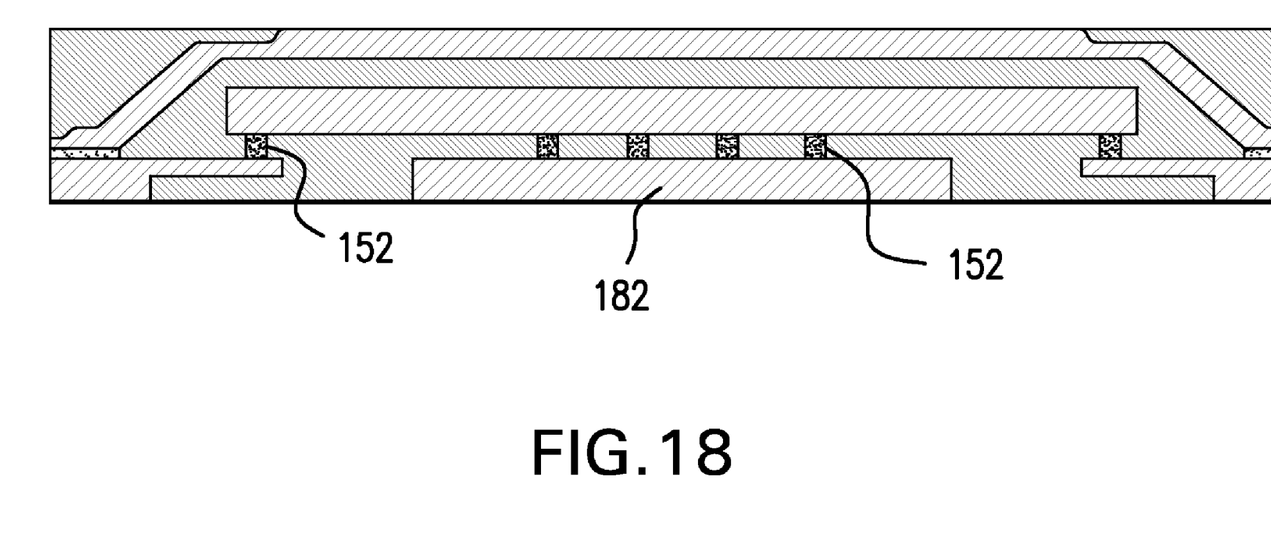
FIG. 18 is a cross-sectional representation of another flip-chip bonded package formed by the process of the invention.

FIG. 13 illustrates a method for the assembly of a flip chip package 150 in accordance with another embodiment of the invention. Most of the assembly steps for the package 150 are similar to the previously described steps. However, the electrically active face of the integrated circuit device 80 is directly bonded to the leads 74, and optionally to a central die pad 182 (FIG. 18), by solder bumps 152. Referring back to FIG. 13, solder bumps 152 typically have the height of 0.07 mm and are formed from a suitable solder such as lead-base eutectic, high lead content and pillar bump. Projections 154, 154' extend into the molding resin 91 mechanically locking leads 74 and heat spreader 88 in place.

Alternative flip chip packages, 150, 160, 170, 180 embodiments of the packages of the invention are shown in FIGS. 14 through 17. Most of the features have been previously described. For the flip chip version, the thermal grease 136 is electrically and thermally conductive and electrically and thermally interconnects the heat spreader 102, 112 and electrically inactive face of integrated circuit device 80. As above, thermal epoxies, solder pastes, and conductive tape may substitute for the thermal grease. One suitable thermal epoxy is filled with in excess of 60 weight percent of silver powder.

In both the flip chip version and the wire bonded/TAB bonded version, a surface 158 of the heat spreader of any of the heat spreaders 88 may be exposed to the environment forming a planar surface with a sidewall 94" surface of the molding resin 91. In addition to providing a marking surface, the surface 158 may be exposed to forced air, a thermally conductive fluid or a heat sink to improve thermal management. The shape of the exposed surface may be square, rectangular, circular or any other shape.

Figure 19:
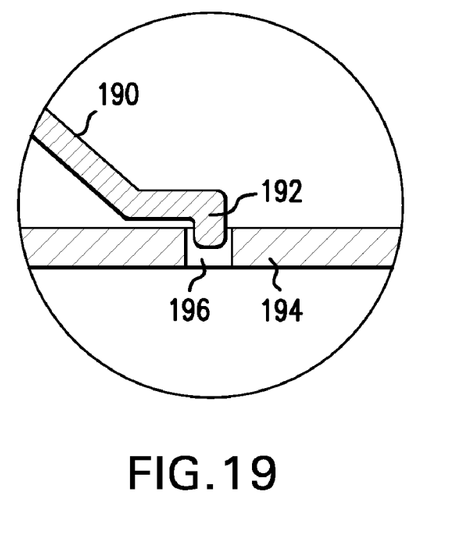
FIG. 19 is a cross-sectional representation of a heat spreader flange showing an alignment feature.

Referring now to FIG. 19, heat spreader tie bars 190 may have bumps 192 to enhance standoff clearance from the wires used for wire bonding. Bumps 192 are also useful to align and lock the heat spreader in position on leads 194. Apertures 196 may be formed in the leads 194 to further enhance alignment and locking.

Figure 20:
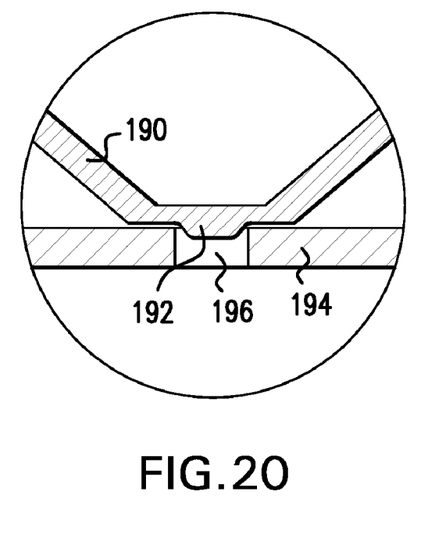
FIG. 20 is a cross-sectional representation of a heat spreader flange showing an alternative alignment feature.

Alternatively, as shown in FIG. 20, bumps 192 may be formed in the package leads 194 or lead frame tie bars. Apertures 196 may be formed in heat spreader tie bars 190. The bumps 192 again function as alignment and locking features. The bumps are typically formed during the chemical etching process or by coining/punching during the upset process.

Figure 21:
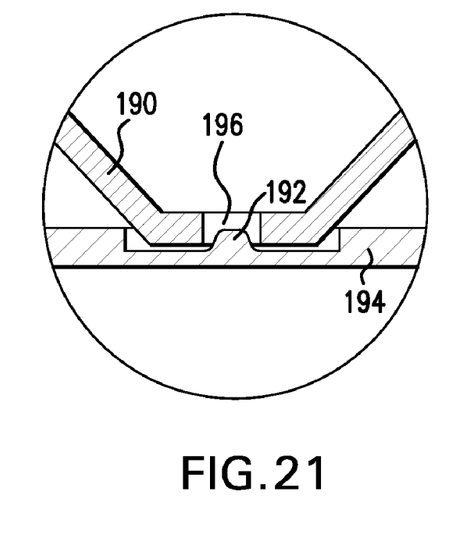
FIG. 21 is a cross-sectional representation of a lead showing an alignment feature.

Referring now to FIG. 21, in another embodiment, package leads 194 may include a bump 192 and heat spreader tie bar 190 may include an aperture 196. Aperture 196 and bump 192 are configured to function as an alignment and locking feature.

While the assembly process describes the array of leads and array of heat spreaders being molded together and subsequently singulated, it is within the scope of the invention for the heat spreaders and leads to be singulated prior to encapsulation with the molding resin and a pick and place process used to place individual lead frame assemblies and individual heat spreaders in individual mold cavities for encapsulation.

One or more embodiments of the present invention have been described. Nevertheless, it will be understood that various modifications may be made without departing from the spirit and scope of the invention. For example, the process may be used for the manufacture of a DFN package or to encapsulate one or more semiconductor devices and passive electrical devices such as in a hybrid package. Accordingly, other embodiments are within the scope of the following claims.

What is claimed is:
1. A semiconductor package comprising:
a plurality of leads having inner lead ends and outer lead ends disposed about a centrally disposed die pad;
a plurality of die pad tie bars extending outward from the die pad and having outer tie bar ends;
an integrated circuit device having an electrically inactive face bonded to said die pad and an electrically active face electrically interconnected to said inner ends by wires or TAB bonds;
a heat spreader corresponding to each die pad, the heat spreader in non-contact proximity to said electrically active face whereby said integrated circuit device is disposed between said die pad and said heat spreader, the heat spreader having
a central portion having a planar first surface opposite and substantially parallel to said electrically active face, and
an outer portion in contact with at least one of
the outer lead ends of leads on opposite sides of the die pad and
the outer tie bar ends of die pad tie bars at opposite ends of the die pad,
wherein
the outer portion includes a first thinned portion at an end thereof in contact with said outer lead ends or said outer tie bar ends and the central portion includes a full thickness portion having a planar surface opposite the first surface, and a second thinned portion spaced apart from the die pad and having a lower surface integral with said first surface and an upper surface parallel to said first surface; and a molding resin encapsulating said integrated circuit device, at least a portion of said heat spreader, at least a portion of said leads, and at least a portion of said die pad tie bars, leaving exposed a portion of each of said outer lead ends and said outer tie bar ends and forming a planar side surface with the exposed portion of an outer lead end, wherein said molding resin encapsulates all of the second thinned portion and leaves exposed part of the first thinned portion, said planar side surface includes said exposed part of the first thinned portion, and the package has a bottom surface and a planar sidewall substantially perpendicular thereto, said sidewall including said planar side surface.

2. A semiconductor package according to claim 1 wherein said heat spreader is selected from the group consisting of copper, aluminum, copper-base alloys, and aluminum-base alloys.

3. A semiconductor package according to claim 2 wherein said heat spreader is an aluminum-base alloy coated with a black anodization and a surface of said heat spreader is exposed in planar relationship with said molding resin.

4. A semiconductor package according to claim 2 wherein said heat spreader is a copper-base alloy coated with nickel.

5. A semiconductor package according to claim 1, wherein the outer portion of the heat spreader is affixed to the outer ends of the leads by an adhesive.

* * * * *